United States Patent
Dau et al.

(10) Patent No.: US 9,933,479 B2
(45) Date of Patent: Apr. 3, 2018

(54) MULTI-DIE INTERFACE FOR SEMICONDUCTOR TESTING AND METHOD OF MANUFACTURING SAME

(71) Applicant: Spire Manufacturing, Inc., Fremont, CA (US)

(72) Inventors: Hai Dau, San Ramon, CA (US); Lim Hooi Weng, Singapore (SG); Kothandan Shanmugam, Singapore (SG); Christine Bui, Gilroy, CA (US)

(73) Assignee: Spire Manufacturing, Fremont, CA (US)

( * ) Notice: Subject to any disclaimer, the term of this patent is extended or adjusted under 35 U.S.C. 154(b) by 0 days.

(21) Appl. No.: 14/938,835

(22) Filed: Nov. 11, 2015

(65) Prior Publication Data

US 2017/0131348 A1    May 11, 2017

(51) Int. Cl.
*G01R 31/28* (2006.01)
*G01R 1/067* (2006.01)

(52) U.S. Cl.
CPC ......... *G01R 31/2889* (2013.01); *G01R 1/067* (2013.01); *G01R 31/2891* (2013.01)

(58) Field of Classification Search
CPC .................. G01R 31/2889; G01R 31/2891
See application file for complete search history.

(56) References Cited

U.S. PATENT DOCUMENTS

| | | | | |
|---|---|---|---|---|
| 5,537,204 A | * | 7/1996 | Woodhouse | H05K 13/08 356/243.1 |
| 6,050,151 A | * | 4/2000 | Larson | H05K 13/08 33/502 |
| 6,085,573 A | * | 7/2000 | Larson | H05K 13/0413 33/502 |
| 6,400,174 B2 | * | 6/2002 | Akram | G01R 1/0483 324/750.25 |
| 6,954,272 B2 | * | 10/2005 | Lam | G01B 11/272 257/737 |
| 7,506,451 B1 | * | 3/2009 | Ding | G01R 31/2891 33/286 |

* cited by examiner

*Primary Examiner* — Walter L Lindsay, Jr.
*Assistant Examiner* — Milton Gonzalez
(74) *Attorney, Agent, or Firm* — Mark Gonzales

(57) ABSTRACT

The present invention includes an interface apparatus for semiconductor testing. The interface apparatus comprises a housing substrate and two product substrates. The first product substrate has a first micro-scale conductive pattern and is situated within a first opening of the housing substrate. The second product substrate has a second micro-scale conductive pattern and is situated within a second opening of the housing substrate. The first and the second micro-scale conductive patterns are aligned to a conductive semiconductor wafer pattern using a continuous translucent media having targets corresponding to the conductive semiconductor wafer pattern.

20 Claims, 4 Drawing Sheets

MULTI-DIE INTERFACE FOR SEMICONDUCTOR TESTING AND METHOD OF MANUFACTURING SAME

CROSS REFERENCE TO RELATED APPLICATIONS

Not applicable.

BACKGROUND

The present invention relates to an electrical/mechanical interface apparatus, and in particular, to a multi-die interface apparatus for semiconductor testing and method of manufacturing same.

The pads on semiconductor devices are getting smaller. Traditional cantilever probes need to scrub the pad and with smaller areas, the scrub may extend into the die area potentially causing damage to the device.

An alternative solution is the vertical probe. However interfacing these vertical probe contactors to tester equipment has become more difficult as the pitch between device pads becomes less than 100 microns.

Thus, there is a need for interface apparatus for semiconductor testing and method of manufacturing same.

SUMMARY

Embodiments of the present invention include an interface apparatus for semiconductor testing. The interface apparatus includes a housing substrate and two product substrates. The first product substrate has a first micro-scale conductive pattern and is situated within a first opening of the housing substrate. The second product substrate has a second micro-scale conductive pattern and is situated within a second opening of the housing substrate. The first and the second micro-scale conductive patterns are aligned to a conductive semiconductor wafer pattern using a continuous translucent media having targets corresponding to the conductive semiconductor wafer pattern.

In one embodiment the interface apparatus further includes a recessed portion in at least one of the first and second housing substrates thereby providing an internal volume within the housing.

The following detailed description and accompanying drawings provide a better understanding of the nature and advantages of the present invention.

BRIEF DESCRIPTION OF THE DRAWINGS

FIGS. 2 A-B illustrates an interface apparatus according to another embodiment of the present invention.

DETAILED DESCRIPTION

Described herein are techniques for multi-die interface apparatus for semiconductor testing and method of manufacturing same. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
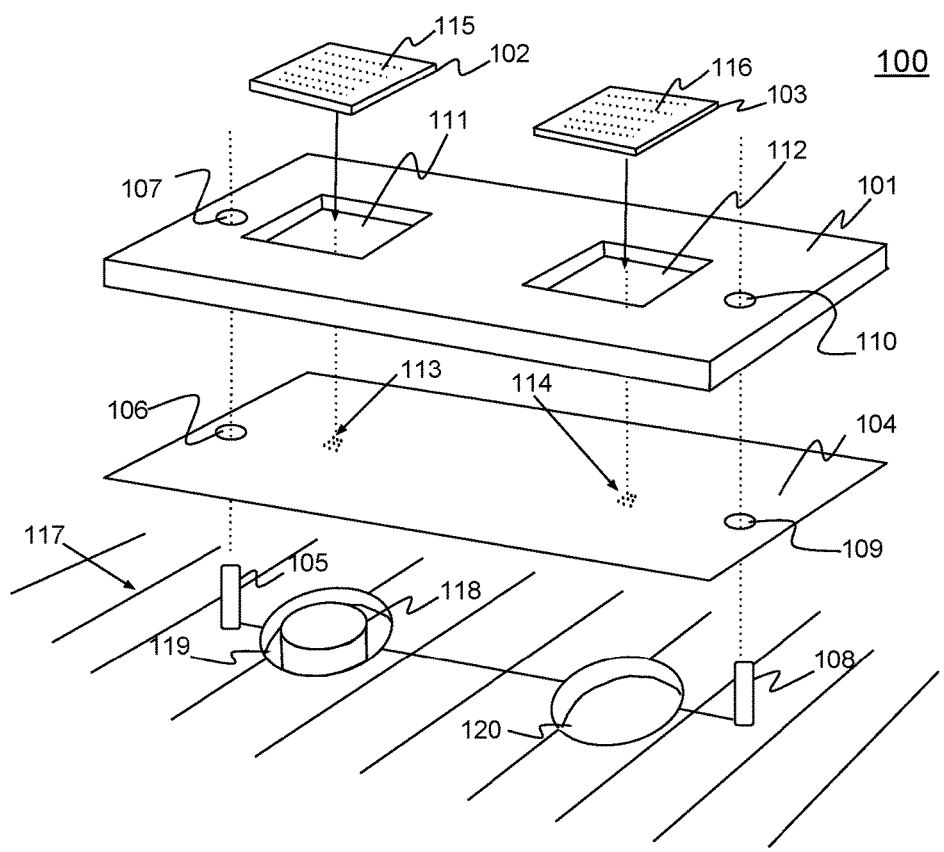
FIG. 1 illustrates an interface apparatus according to one embodiment of the present invention.

FIG. 1 illustrates an interface apparatus 100 according to one embodiment of the present invention. Interface apparatus 100 includes housing substrate 101, product substrate 102, and product substrate 103. Product substrates 102-103 each have a micro-scale conductive pattern (not shown). The micro-scale conductive patterns may be aligned to a conductive semiconductor wafer pattern using continuous translucent media 104 having sets of targets 113-114 corresponding to a conductive semiconductor wafer pattern. Product substrate 102 may be aligned to set of targets 113, and product substrate 103 may be aligned to set of targets 114.

Media 104 may be placed on an assembly surface 117 by placing alignment pins 105 through alignment hole 106 and placing alignment pin 108 through alignment hole 109. Similarly, Housing substrate 101 may be placed on top of translucent media 104 by placing alignment pin 105 through alignment hole 107 and placing alignment pin 108 through alignment hole 110. Product substrates 102-103 may lie on the same plane as a lower surface of housing substrate 101. Translucent media 104 may include laser apertures which function as targets during alignment. Sets of targets 113-114 may be made up of these type of target.

Product substrate 102 may be situated within opening 111 of housing substrate 101. Similarly, product substrate 103 may be situated within opening 112. Product substrates 102-103 may be on top of translucent media 104. Lens 118 may be part of a microscope placed below an opening 119 in the assembly surface 117 to align set of targets 113. Lens 118 may be adjusted to a second position below opening 120 in the assembly surface 117 to align set of targets 114. Sets of targets 113-114 may have a spacing of less than 2 inches between them. The corresponding micro-scale conductive patterns would necessarily have a spacing less than 2 inches between them.

Product substrate 102 includes macro-scale conductive pattern 115, and product substrate 103 includes macro-scale conductive pattern 116. The micro-scale conductive patterns may result from lapping product substrates 102-103 to expose underlying metal. A similar process may be used to remove the bumps associated with macro-scale conductive patterns 115-116. Product substrates may be processed to plate the micro-scale conductive patterns and the macro-scale conductive patterns 115-116, and macro-scale conductive patterns 115-116 may be re-balled to re-form the grid array (BGA) suitable to solder to a printed circuit board (PCB) after assembly of interface apparatus 100.

In one embodiment, product substrates 102-103 may be production integrated circuit (IC) packages. In this embodiment, the IC package may be used as part of an interface apparatus 100 for testing the corresponding IC in production. The interface apparatus 100 may use a package which is partially processed such that the die has not been attached or may use a post processed package in which the die (i.e. IC) is removed prior to using the production package as a product substrate (e.g. product substrate 102 or 103). Product substrates 102-103 may be product specific packages used to interface with their corresponding IC during wafer testing.

Figures 2A, 2B:
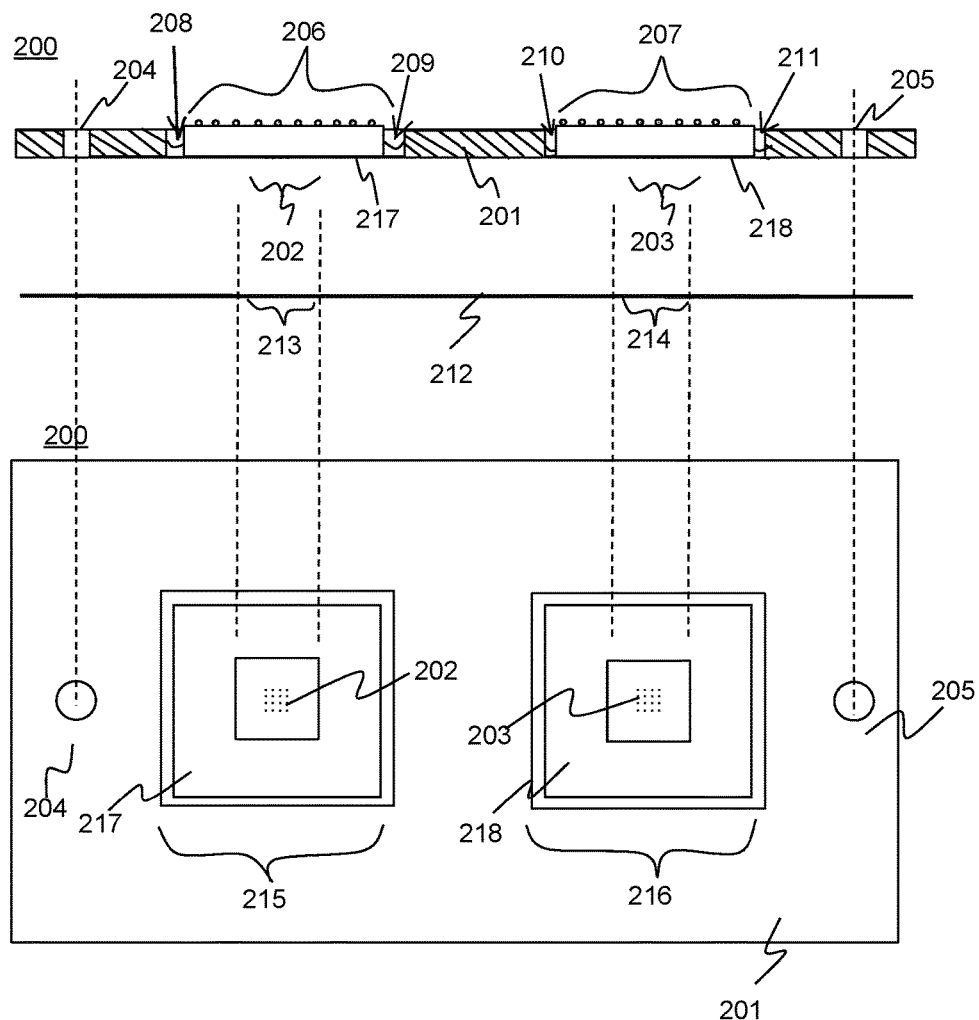
FIG. 2A illustrates a sectioned side view of the interface apparatus.
FIG. 2B illustrates a bottom view of the interface apparatus.

FIGS. 2A-B illustrate an interface apparatus 200 according to another embodiment of the present invention. FIG. 2A shows a cross section view of interface apparatus 200. Interface apparatus 200 includes housing substrate 201 and product substrates 217-218. Housing substrate 201 includes alignment holes 204-205. Product substrates 217-218 include macro-scale conductive patterns 206-207 and micro-scale conductive patterns 201-203 respectively. Macro-scale conductive pattern 206 may couple at least a portion of its conductive points to conductive points associated with micro-scale conductive pattern 202. In a similar manner, macro-scale conductive pattern 207 may couple at least a portion of its conductive points to conductive points associated with micro-scale conductive pattern 203.

Locations 208-211 show spaces between housing substrate 201 and product substrates 217-218. Locations 208-211 are filled with epoxy to affix product substrates 217-218 to housing substrate 201. During assembly, in one embodiment, only particular portion of locations 208-211 may have epoxy to tack product substrates 217-218 to housing substrate 201 immediately after alignment. Tacking may prevent product substrates 217-218 from being unaligned.

FIG. 2A also includes translucent media 212 having sets of targets 213-214. In this embodiment, translucent media 212 is Mylar and sets of targets 213-214 are laser made holes into the Mylar. Translucent media 212 may be a temporary template used to align micro-scale pattern 202 with micro-scale pattern 203 or translucent media 212 may be part of a final assembly including interface apparatus 200, translucent media 212, and a contactor (not shown).

FIG. 2B shows a bottom view of interface apparatus 200. Interface apparatus 200 includes housing substrate 201 and product substrates 217-218. Housing substrate 201 includes alignment holes 204-205 and opening 215-216. Product substrate 217 is situated in opening 215, and product substrate 218 is situated in opening 216. Product substrate 217 includes micro-scale conductive pattern 202, and product substrate 218 includes micro-scale conductive pattern 203. In one embodiment, micro-scale conductive pattern 202 has the same geometry as micro-scale conductive pattern 203.

Figure 3:
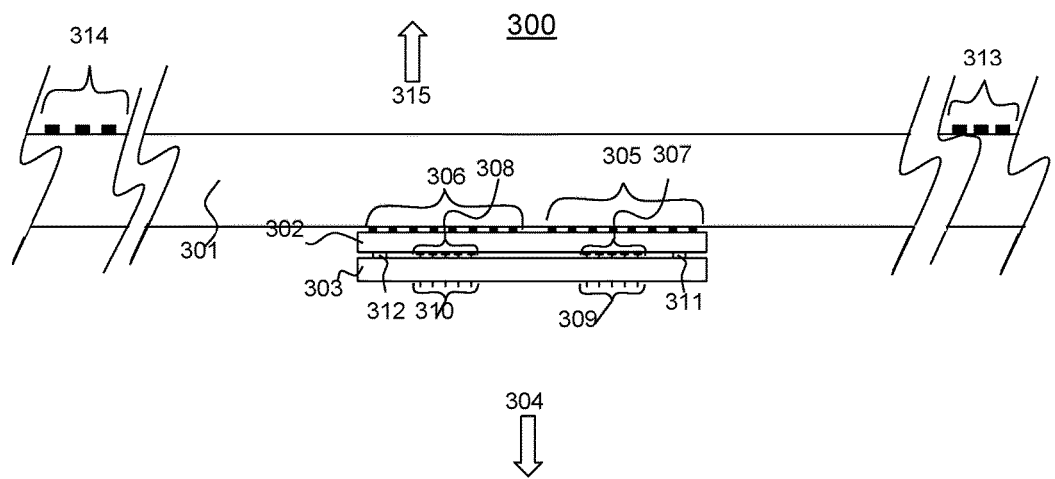
FIG. 3 illustrates a system 300 of interfacing a tester with a vertical probe contactor according to another embodiment of the invention.

FIG. 3 illustrates a system 300 of interfacing a tester with a vertical probe contactor according to another embodiment of the invention. System 300 includes a vertical probe assembly 303, interface apparatus 302, and printed circuit board (PCB) 301. Direction 304 indicates the direction of a semiconductor wafer to be tested.

Vertical probe assembly 303 includes probe set 309 and probe set 310 to contact a semiconductor wafer in direction 304. Vertical probe assembly 303 may be attached to the interface apparatus 302 via screws 311-312. A set of 4 screws may be used to provide even pressure on probe sets 309-310. Interface apparatus 302 includes micro-scale conductive patterns 307-308 coupled to probe sets 309-310 respectively. Interface apparatus 302 couples micro-scale conductive patterns 307-308 to macro-scale conductive patterns 305-306 respectively. The locations of macro-scale conductive patterns 305-306 have a greater pitch than their corresponding micro-scale conductive patterns 307-308. The macro-scale conductive patterns 305-306 may be duplicated with standard PCB fabrication and design. Macro-scale conductive patterns 305-306 couple to PCB 301 via a plurality of conductive pads corresponding to the macro-scale conductive patterns 305-306. PCB 301 may have a plurality of conductive pads to couple to micro-scale conductive patterns 307-308 in this manner.

PCB 301 includes pads 313-314 to interface with a tester from direction 315. Tester instruments are coupled to the semiconductor wafer presented from direction 304. The orientation of FIG. 3 is relative. For many probers the tester head is mounted on top of the PCB 301 which has been mounted on top of the prober. In this scenario, probe sets 309-310 face down from PCB 301 as shown in FIG. 3.

Interface apparatus 302 may be similar to interface apparatus 200 of FIGS. 2A-B described above. Interface apparatus 302 may be aligned in a similar manner as described above in regard to interface apparatus 100 of FIG. 1.

Figure 4:
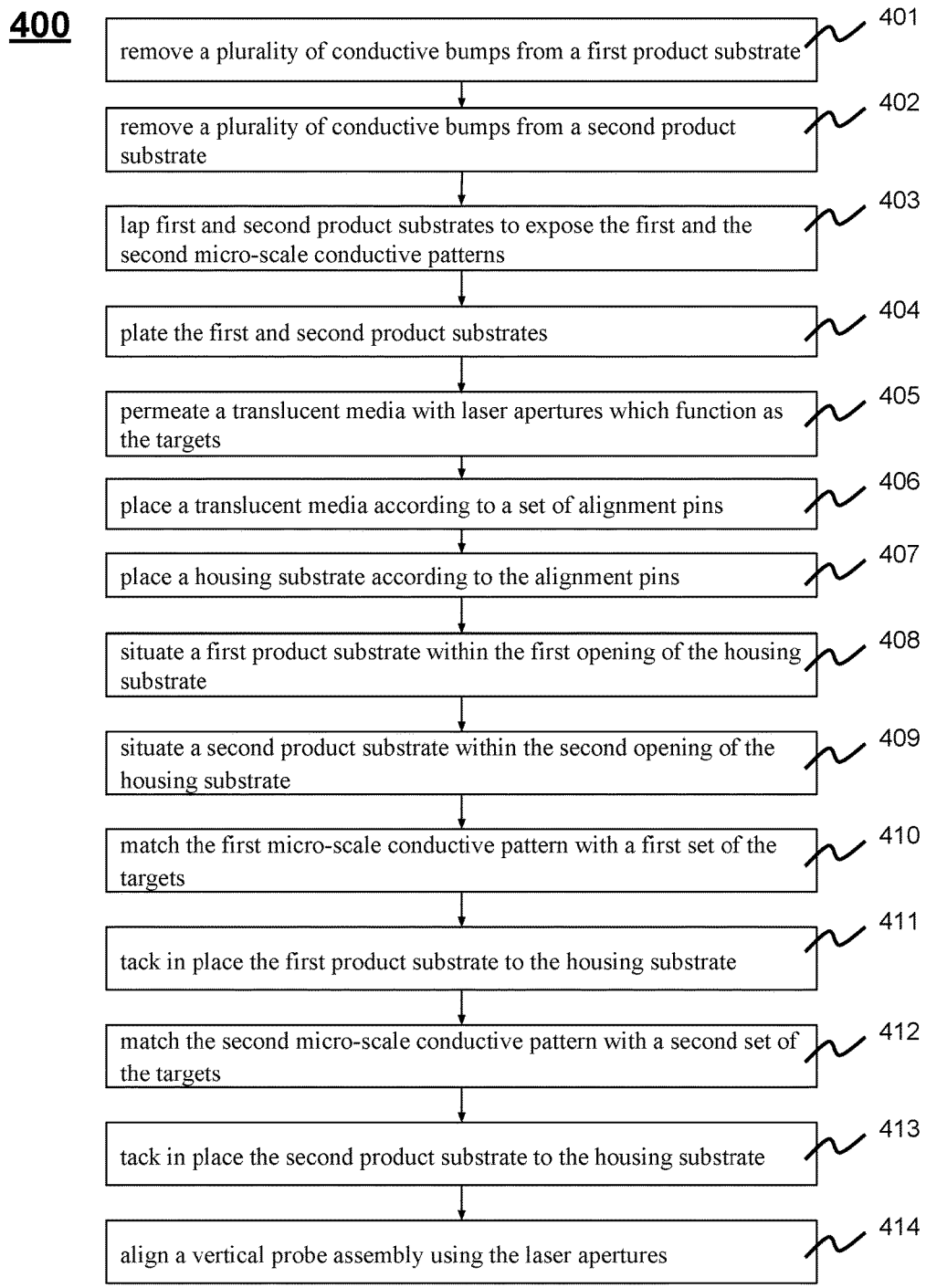
FIG. 4 illustrates a method 400 of manufacturing an interface apparatus according to another embodiment of the present invention.

FIG. 4 illustrates a method 400 of manufacturing an interface apparatus according to another embodiment of the present invention. Method 400 may include the following.

At 401, remove a plurality of conductive bumps from a first product substrate. This exposes a first macro-scale conductive pattern located on the opposite face opposing a first micro-scale conductive pattern.

At 402, remove a plurality of conductive bumps from a second product substrate. This exposes a second macro-scale conductive pattern located on the opposite face opposing the second micro-scale conductive pattern.

At 403, lap first and second product substrates to expose the first and the second micro-scale conductive patterns.

At, 404, plate the first and second product substrates. The plating may include the micro-scale and macro-scale conductive patterns being plated in the same plating process.

At 405, permeate a translucent media with laser apertures which function as the targets.

At 406, place a translucent media according to a set of alignment pins. The translucent media may have targets which correspond to a conductive semiconductor wafer pattern.

At 407, place a housing substrate according to the alignment pins to give a first order of alignment between the targets and a first and a second opening of the housing substrate.

At 408, situate a first product substrate within the first opening of the housing substrate. The first product substrate has a first micro-scale conductive pattern. The situating may include the first product substrate lying on top of the translucent media.

At 409, situate a second product substrate within the second opening of the housing substrate. The second product substrate has a second micro-scale conductive pattern. The situating may include the second product substrate lying on top of the translucent media.

At 410, match the first micro-scale conductive pattern with a first set of the targets. The matching may include matching the first micro-scale conductive pattern with a first set of the targets using a microscope positioned to view the first micro-scale conductive pattern through the translucent media.

At 411, tack in place the first product substrate to the housing substrate.

At 412, match the second micro-scale conductive pattern with a second set of the targets. The matching may include matching the second micro-scale conductive pattern with a second set of the targets using a microscope positioned to view the second micro-scale conductive pattern through the translucent media.

The matching the first and second micro-scale conductive patterns may include taking optical images of the first and the second micro-scale conductive patterns through the translucent media from below. The matching may provide a second order of alignment between the first and the second micro-scale conductive patterns.

At 413, tack in place the second product substrate to the housing substrate.

At 414, align a vertical probe assembly using the laser apertures.

The above description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure, other arrangements, embodiments, implementations and equivalents will be evident to those skilled in the art and may be employed without departing from the spirit and scope of the invention.

What is claimed is:

1. An interface apparatus for semiconductor testing, said interface apparatus comprising:
    a housing substrate;
    a first product substrate having a first micro-scale conductive pattern, said first product substrate situated within a first opening of said housing substrate; and
    a second product substrate having a second micro-scale conductive pattern, said second product substrate situated within a second opening of said housing substrate,
    wherein said first and said second micro-scale conductive patterns are aligned to a conductive semiconductor wafer pattern using a continuous translucent media having targets corresponding to said conductive semiconductor wafer pattern.

2. The interface apparatus of claim 1, wherein said first and said second micro-scale conductive patterns result from lapping said first and second product substrates to expose underlying metal.

3. The interface apparatus of claim 1, further comprising a first macro-scale conductive pattern located on an opposite face opposing said first micro-scale conductive pattern.

4. The interface apparatus of claim 1, wherein said first and said second product substrates lie on the same plane as a lower surface of said housing substrate.

5. The interface apparatus of claim 1, wherein said first and said second micro-scale conductive patterns have the same geometry and a spacing between said first and said second micro-scale conductive patterns is less than 2 inches.

6. The interface apparatus of claim 1, wherein said translucent media includes laser apertures which function as targets during alignment.

7. A method of manufacturing an interface apparatus, said method comprising:
    placing a translucent media according to a set of alignment pins, said translucent media having targets corresponding to a conductive semiconductor wafer pattern;
    placing a housing substrate according to said alignment pins to give a first order of alignment between said targets and a first and a second openings of said housing substrate;
    situating a first product substrate within said first opening of said housing substrate, said first product substrate having a first micro-scale conductive pattern;
    situating a second product substrate within said second opening of said housing substrate, said second product substrate having a second micro-scale conductive pattern;
    matching said first micro-scale conductive pattern with a first set of said targets; and
    matching said second micro-scale conductive pattern with a second set of said targets,
    wherein said matching provides a second order of alignment between said first and said second micro-scale conductive patterns.

8. The method of claim 7, further comprising lapping said first and second product substrates to expose said first and said second micro-scale conductive patterns.

9. The method of claim 7, further comprising removing a plurality of conductive bumps from said first product substrate, thereby exposing a first macro-scale conductive pattern located on an opposite face opposing said first micro-scale conductive pattern.

10. The method of claim 7, wherein said situating includes said first and said second product substrates lying on top of said translucent media.

11. The method of claim 10, wherein said matching includes taking optical images of said first and said second micro-scale conductive patterns through said translucent media from below.

12. The method of claim 7, further comprising permeating said translucent media with laser apertures which function as said targets.

13. The method of claim 12, further comprising aligning a vertical probe assembly using said laser apertures.

14. The method of claim 7, further comprising:
    tacking in place said first product substrate to said housing substrate; and
    tacking in place said second product substrate to said housing substrate.

15. The method of claim 7, wherein matching said first micro-scale conductive pattern with said first set of said targets includes using a microscope positioned to view said first micro-scale conductive pattern through said translucent media, and
    wherein matching said second micro-scale conductive pattern with said second set of said targets includes using said microscope positioned to view said second micro-scale conductive pattern through said translucent media.

16. A system for interfacing a semiconductor wafer pattern with an automated tester, said system comprising:
    an interface apparatus comprising,
        a housing substrate;
        a first product substrate having a first micro-scale conductive pattern, said first product substrate situated within a first opening of said housing substrate; and
        a second product substrate having a second micro-scale conductive pattern, said second product substrate situated within a second opening of said housing substrate,
        wherein said first and said second micro-scale conductive patterns are aligned to a conductive semiconductor wafer pattern using a continuous translucent media having targets corresponding to said conductive semiconductor wafer pattern; and
    a printed circuit board (PCB) having a plurality of conductive pads coupled to said first and said second micro-scale conductive patterns.

17. The system of claim 16, wherein said first and said second micro-scale conductive patterns result from lapping said first and second product substrates to expose underlying metal.

18. The system of claim 16, wherein said translucent media includes laser apertures which function as targets during alignment.

19. The system of claim 18, further comprising a vertical probe assembly to couple said plurality of conductive pads to said conductive semiconductor wafer pattern, wherein said vertical probe assembly is aligned using said laser apertures.

20. The system of claim 16, further comprising:
- a first macro-scale conductive pattern located on an opposite face opposing said first micro-scale conductive pattern; and
- a second macro-scale conductive pattern located on an opposite face opposing said second micro-scale conductive pattern, wherein said first and said second macro-scale conductive patterns were bumped in order to couple said plurality of conductive pads to said first and said second micro-scale conductive patterns.

* * * * *